United States Patent
Ishii et al.

(10) Patent No.: US 11,756,793 B2
(45) Date of Patent: Sep. 12, 2023

(54) SEMICONDUCTOR DEVICE MANUFACTURING METHOD

(71) Applicant: Hitachi High-Tech Corporation, Tokyo (JP)

(72) Inventors: Yohei Ishii, Hillsboro, OR (US); Kathryn Maier, Hillsboro, OR (US); Medhat Khalil, Hillsboro, OR (US)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/906,206

(22) Filed: Jun. 19, 2020

(65) Prior Publication Data

US 2021/0202259 A1 Jul. 1, 2021

Related U.S. Application Data

(60) Provisional application No. 62/954,101, filed on Dec. 27, 2019.

(51) Int. Cl.
| | | |
|---|---|---|
| *H01L 21/306* | (2006.01) | |
| *H01L 21/3213* | (2006.01) | |
| *H01L 21/3065* | (2006.01) | |
| *H01L 21/308* | (2006.01) | |

(52) U.S. Cl.
CPC .... *H01L 21/30621* (2013.01); *H01L 21/3065* (2013.01); *H01L 21/30604* (2013.01); *H01L 21/32136* (2013.01); *H01L 21/32138* (2013.01); *B81C 2201/0136* (2013.01); *H01L 21/308* (2013.01)

(58) Field of Classification Search
CPC ........... H01L 21/30621; H01L 21/3065; H01L 21/32136; H01L 21/30604; H01L 21/32138; H01L 21/308; B22C 2201/0136; B81C 2201/0136

See application file for complete search history.

(56) References Cited

U.S. PATENT DOCUMENTS

| | | | |
|---|---|---|---|
| 4,925,813 A | 5/1990 | Autier et al. | |
| 6,197,697 B1 * | 3/2001 | Simpson | H01L 21/3043 216/62 |
| 6,531,403 B2 * | 3/2003 | Ezaki | C23C 14/48 438/710 |

(Continued)

FOREIGN PATENT DOCUMENTS

| | | | |
|---|---|---|---|
| CN | 107230683 A | 10/2017 | |
| FR | 2633451 A1 * | 12/1989 | H01L 21/3081 |

(Continued)

OTHER PUBLICATIONS

Office Action dated Jun. 9, 2021 in Taiwanese Application No. 109145875.

(Continued)

*Primary Examiner* — Binh X Tran
(74) *Attorney, Agent, or Firm* — MILES & STOCKBRIDGE, P.C.

(57) ABSTRACT

A semiconductor device manufacturing method includes the steps of etching a semiconductor material by using plasma, forming a damage layer on the semiconductor material, and removing the damage layer such that a relatively low temperature process can form a fine pattern with a vertical cross section using a compound semiconductor material or the like.

7 Claims, 11 Drawing Sheets

(56) References Cited

U.S. PATENT DOCUMENTS

| | | | |
|---|---|---|---|
| 9,799,702 B2* | 10/2017 | Cheng | H01L 27/14683 |
| 2003/0146485 A1 | 8/2003 | Ezaki | |
| 2012/0276658 A1* | 11/2012 | Godet | H01L 21/30612 |
| | | | 438/3 |
| 2016/0035581 A1* | 2/2016 | Posseme | H01L 21/306 |
| | | | 438/705 |
| 2017/0062512 A1 | 3/2017 | Chou et al. | |
| 2017/0178894 A1 | 6/2017 | Stone et al. | |
| 2018/0001582 A1* | 1/2018 | Posseme | B29D 11/00365 |
| 2018/0047777 A1 | 2/2018 | Cheng et al. | |

FOREIGN PATENT DOCUMENTS

| | | |
|---|---|---|
| JP | 2001148543 A | 5/2001 |
| JP | 2001345310 A | 12/2001 |
| JP | 2005129632 A | 5/2005 |
| JP | 2005210089 A | 8/2005 |
| JP | 201040780 A | 2/2010 |
| TW | I595646 B | 8/2017 |
| TW | 201732872 A | 9/2017 |

OTHER PUBLICATIONS

Office Action dated Nov. 24, 2021 in Japanese Application No. 2020-206510.

Office Action dated Apr. 23, 2022 in Korean Application No. 10-2020-0172900.

Office Action dated Apr. 19, 2023 in Chinese Application No. 202011499279.4.

* cited by examiner

SEMICONDUCTOR DEVICE MANUFACTURING METHOD

BACKGROUND OF THE INVENTION

The present invention relates to a semiconductor device manufacturing method which uses a compound semiconductor material or the like.

As the integration density of semiconductor devices increases and the miniaturization of patterns formed on substrates progresses, the demand for a material with high electron mobility as a channel material is growing.

As high-mobility channel materials, compound semiconductors such as III-V group materials are known. Patent document 1 (Japanese Unexamined Patent Application Publication No. 2010-40780) describes that a compound semiconductor containing indium (In) is plasma-etched.

SUMMARY OF THE INVENTION

Compound semiconductors such as III-V group materials are low in volatility (refractory) and have the problem that it is difficult to perform anisotropic processing on them.

As a solution to this problem, The patent document 1 describes that when processing a compound semiconductor containing indium (In), plasma etching is performed in which the workpiece is heated to high temperature and processed in a plasma.

However, compound semiconductors are low in volatility and have the problem that it is difficult to perform anisotropic processing on them. In addition, due to their low volatility, the etching speed of the lower portion of the pattern being formed (portion nearer to the substrate) is slower than the etching speed of the upper portion of the pattern (portion nearer to the plasma), and consequently a tapered-shape pattern in which a size of the lower portion of the pattern is larger than that of the upper portion is formed, although desirably the cross section of the pattern should be vertical. In other words, these materials have the problem that it is difficult to form a pattern with a vertical cross section.

Furthermore, in order to heat the workpiece to high temperature and process it, the mask material must be a relatively expensive material which can withstand the high temperature.

The present invention provides a semiconductor device manufacturing method which solves the above problem of the related art and can form a fine pattern with a vertical cross section using a compound semiconductor material or the like through a relatively low temperature process.

In order to solve the above problem, according to the present invention, there is provided a method for forming a pattern of a semiconductor material on a substrate by processing the semiconductor material, in which the semiconductor material is plasma-etched, a damage layer is formed on the semiconductor material, and the damage layer is removed by wet etching or plasma processing.

According to the present invention, a fine pattern with a vertical cross section can be formed by processing a semiconductor material.

DETAILED DESCRIPTION OF THE PREFERRED EMBODIMENTS

The present invention concerns a semiconductor device manufacturing method which forms a pattern of a semiconductor material by processing the semiconductor material. The method includes a process of plasma-etching the semiconductor material, a process of forming a damage layer in the semiconductor material, and a process of removing the formed damage layer by wet etching or plasma processing.

The present invention is characterized by combining the plasma processing process including the anisotropic processing step by plasma etching and the damage layer forming step to form a damage layer in the remaining tapered portion after the anisotropic processing step, and the wet-etching process or plasma-etching process to remove the formed damage layer.

In the damage layer forming step, the desired damage layer is formed in the tapered portion after the anisotropic processing step by controlling the energy of ions incident on the substrate through the process using a light element (hydrogen, helium).

Furthermore, in the present invention, as a process condition, in order to form a damage layer in the remaining tapered portion after removal of the semiconductor material by plasma etching, the ion energy (substrate bias power) is determined so that the ion incidence depth covers the entire tapered portion.

Furthermore, since normal (vertical) incidence of ions is required (to prevent the formation of a damage layer under the mask), the pressure in the damage layer forming step should be within a pressure range in which ion collision does not occur in the sheath.

Furthermore, in the present invention, if the semiconductor material is a compound semiconductor material, a gas as a mixture of chlorine ($Cl_2$) and hydrogen ($H_2$) or a gas as a mixture of chlorine ($Cl_2$), hydrogen ($H_2$) and methane ($CH_4$) is used in the anisotropic processing step.

Next, embodiments of the present invention will be described referring to drawings.

First Embodiment

Figure 1:
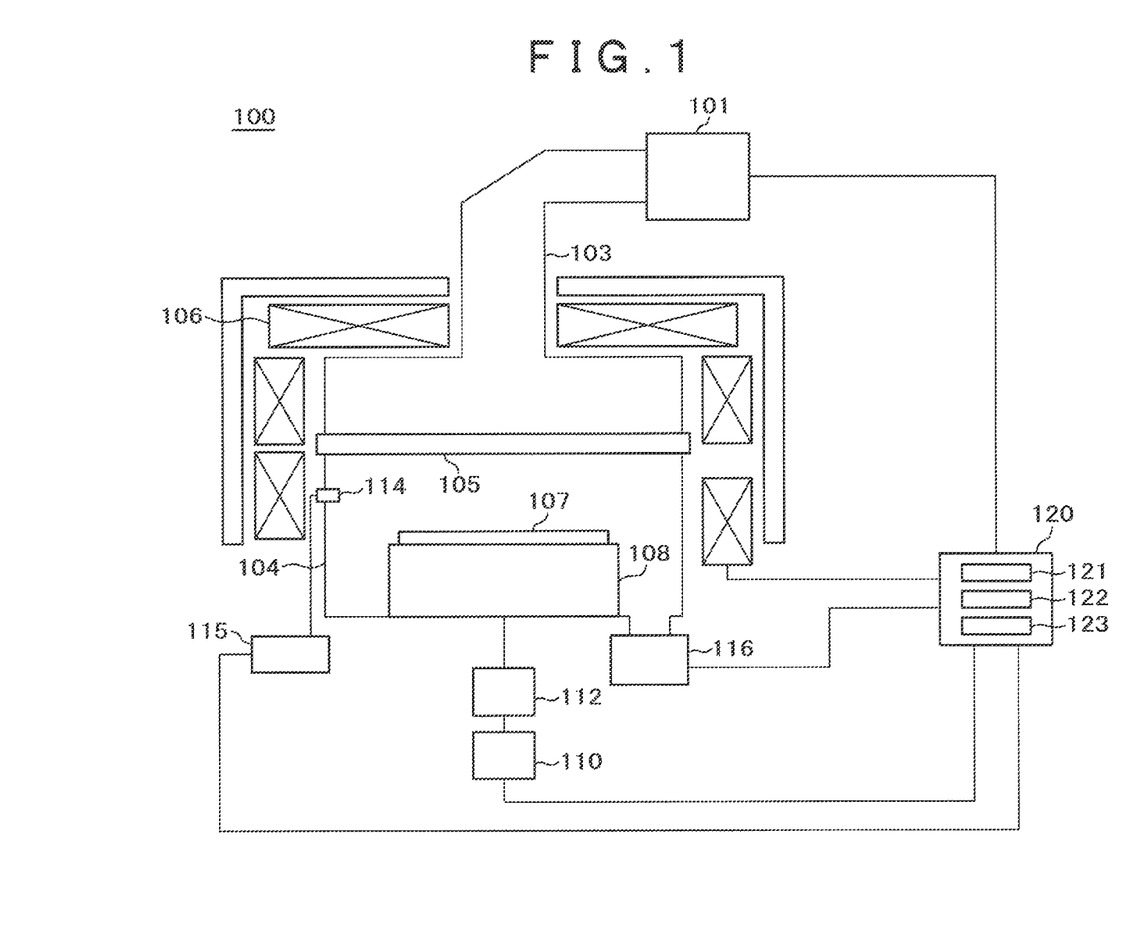
FIG. 1 is a block diagram which schematically shows the structure of a plasma etching apparatus according to a first embodiment of the present invention.

FIG. 1 is a block diagram which shows the structure of the plasma etching apparatus 100 used for the plasma etching process and the damage layer forming process in this embodiment.

The plasma etching apparatus 100 shown in FIG. 1 according to this embodiment includes: an etching chamber 104; a microwave power source 101; a waveguide 103 connecting the microwave power source 101 with the etching chamber 104; a dielectric window 105 for supplying the etching gas introduced into the etching chamber 104 in the upper part of the etching chamber 104 to the etching chamber 104 and introducing the microwave power, for example, with a frequency of 2.45 GHz, propagated from the waveguide 103 into the etching chamber 104; and electromagnetic coils 106 arranged around the etching chamber 104 to generate a magnetic field in the etching chamber 104, so that a microwave ECR plasma is generated in the etching chamber 104.

A sample holder 108 on which a sample 107 is placed is provided inside the etching chamber 104, and also a radio frequency power source 110 for applying radio frequency power to the sample holder 108 to introduce the ions in the plasma into the sample 107 placed on the sample holder 108 and a matching circuit 112 for adjusting the radio frequency impedance of the sample holder 108 with respect to the radio frequency power source 110 are provided. The sample holder 108 is installed inside the etching chamber 104.

The plasma etching apparatus 100 further includes: a gas supply section 114 for supplying processing gas into the etching chamber 104; a gas flow rate control section 115 for controlling the flow rate of processing gas to be supplied from the gas supply section 114 into the etching chamber 104; and an evacuation section 116 for vacuumizing the inside of the etching chamber 104.

120 denotes a controller which controls the microwave power source 101, electromagnetic coils 106, radio frequency power source 110, gas flow rate control section 115, evacuation section 116, and so on.

The controller 120 includes a storage 121, an arithmetic processor 122, and a CPU 123. The storage 121 stores the program for processing the sample 107 in the plasma etching apparatus 100, and the product processing conditions for controlling the microwave power source 101, electromagnetic coils 106, radio frequency power source 110, gas flow rate control section 115, evacuation section 116, and so on.

The arithmetic processor 122 performs various arithmetic operations and, for example, calculates the average radio frequency power for generating the plasma which should be transmitted from the microwave power source 101, according to the product processing conditions stored in the storage 121.

The CPU 123 controls the microwave power source 101, electromagnetic coils 106, radio frequency power source 110, gas flow rate control section 115, evacuation section 116, and so on according to the program for processing the sample 107 in the plasma etching apparatus 100 and the product processing conditions which are stored in the storage 121.

The controller 120 controls the microwave power source 101, electromagnetic coils 106, radio frequency power source 110, and so on according to the average radio frequency power calculated by the arithmetic processor 122.

In the plasma etching apparatus 100 thus structured, microwave power is first transmitted from the microwave power source 101 and the transmitted microwave power is passed through the waveguide 103 and transmitted to the etching chamber 104.

The dielectric window 105 is located in the upper part of the etching chamber 104 to encapsulate the etching gas into the lower part of the etching chamber 104, and the inside of the etching chamber 104 under the dielectric window 105 as a boundary is vacuumized by the evacuation section 116 and maintained under a vacuum.

While the etching gas whose flow rate is controlled by the gas flow rate control section 115 is supplied from the gas supply section 114 at a prescribed flow rate into the etching chamber 104 maintained under a vacuum, the microwave power propagated through the waveguide 103 is transmitted through the dielectric window 105 and introduced into the etching chamber 104.

The electromagnetic coils 106 are arranged around the etching chamber 104. An electron cyclotron resonance is generated by the magnetic field generated in the etching chamber 104 by the electromagnetic coils 106 and the microwave power introduced into the etching chamber 104 through the dielectric window 105.

The electron cyclotron resonance generated in the etching chamber 104 makes it possible to efficiently plasmatize the etching gas introduced into the etching chamber 104 by gas introducing means (not shown).

Figure 2:
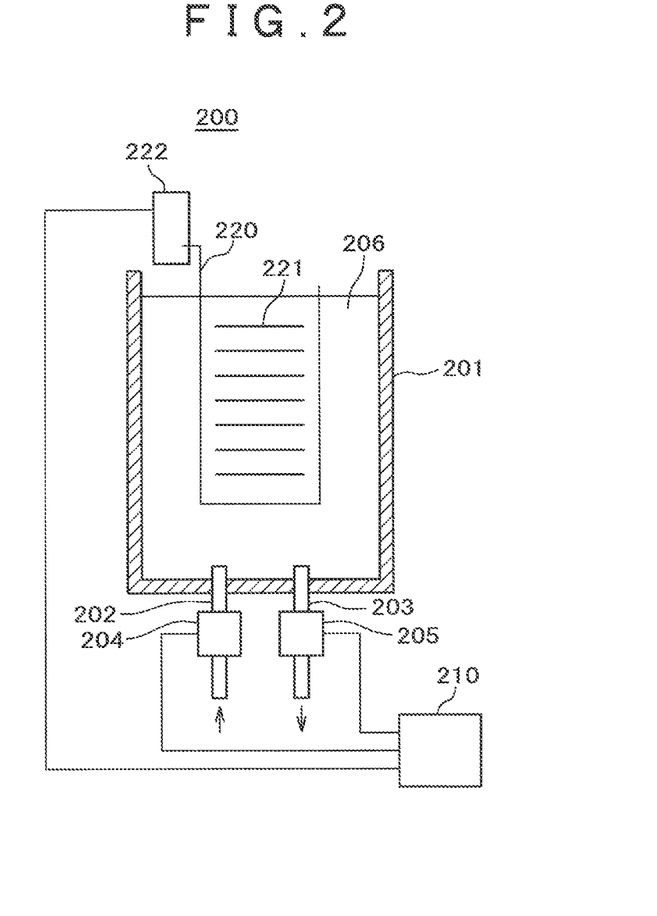
FIG. 2 is a block diagram which schematically shows the structure of a wet etching apparatus according to the first embodiment of the present invention.

FIG. 2 is a sectional view which schematically shows the structure of the wet etching apparatus 200 used for the wet etching process in this embodiment.

The wet etching apparatus 200 shown in FIG. 2 includes: a processing liquid tank 201 for accumulating an etching (processing) liquid 206; a supply pipe 202 for supplying the processing liquid to the processing liquid tank 201; a discharge pipe 203 for discharging the processing liquid from the processing liquid tank 201; a supply liquid flow rate adjusting section 204 for adjusting the flow rate of the processing liquid to be supplied to the processing liquid tank 201 through the supply pipe 202; a discharge liquid flow rate adjusting section 205 for adjusting the flow rate of the processing liquid to be discharged from the processing liquid tank 201 through the discharge pipe 203; a control section 210 for controlling the supply liquid flow rate adjusting section 204 and the discharge liquid flow rate adjusting section 205; a substrate carrier 220 for carrying a sample 221; and a substrate carrier drive 222 for moving the substrate carrier 220 into or out of the etching liquid 206 accumulated in the processing liquid tank 201 under the control by the control section 210.

Referring to FIGS. 3 to 9, an explanation is given below of the method in which a pattern of a refractory material such as a compound semiconductor on a substrate is formed by processing the refractory material such as a compound semiconductor using the plasma etching apparatus 100 shown in FIG. 1 and the wet etching apparatus 200 shown in FIG. 2.

In the explanation of this embodiment, III-V group compound semiconductors, II-VI group compound semiconductors, III-VI group compound semiconductors, oxide semiconductors, and nitride semiconductors are all referred to as compound semiconductors.

Figure 3:
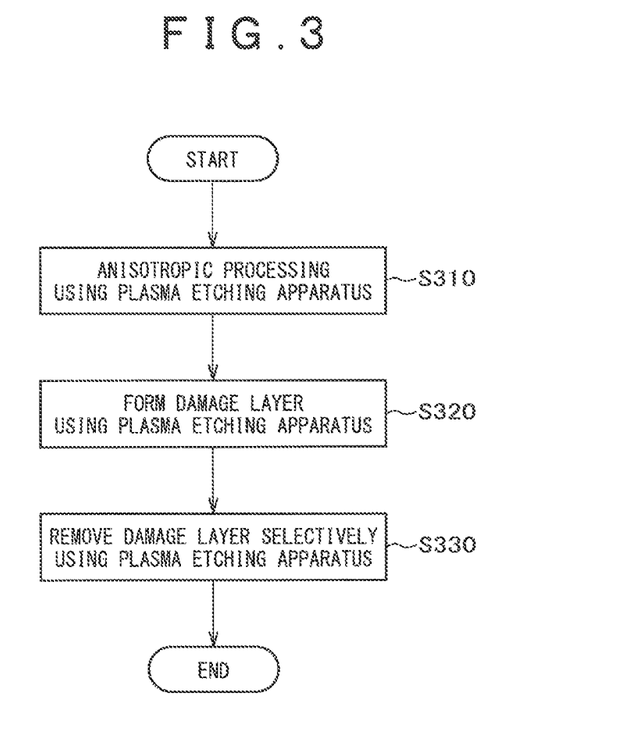
FIG. 3 is a flowchart which shows the processing flow in the method for processing a compound semiconductor material according to the first embodiment of the present invention.
Figure 7:
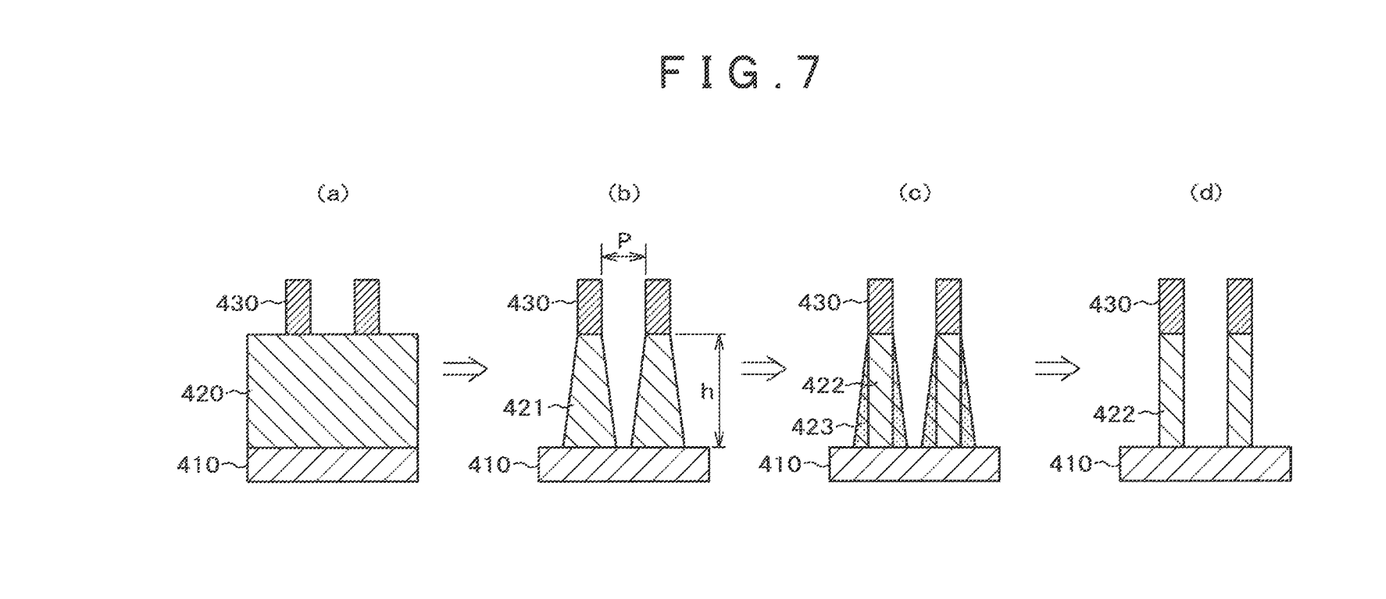
FIG. 7 is a Sectional views of a sample in the steps of processing a compound semiconductor material according to the first embodiment of the present invention, in which (a) shows a sample with a layer of a compound semiconductor material formed on a substrate, (b) shows the sample subjected to anisotropic processing, (c) shows a damage layer, and (d) shows the sample after removal of the damage layer.

FIG. 3 shows the overall processing flow. This embodiment uses a workpiece in which a layer 420 of a compound semiconductor material with a cross section as shown in FIG. 7(a) is formed on a substrate (for example, single-crystal silicon substrate) 410 and a mask pattern 430 is formed over it, as the sample to be processed. An etching stopper layer is formed on the surface of the substrate (for example, single-crystal silicon substrate) 410.

First, at S310, the sample 107 with the mask pattern 430 formed on the surface is processed using the plasma etching apparatus 100 shown in FIG. 1 and anisotropic processing is performed by plasma-etching the layer of the compound semiconductor material. FIG. 7(b) shows the cross section of the sample subjected to the anisotropic processing. In this state, the width of the portion nearer to the substrate 410 is larger than the width of the portion nearer to the mask pattern 430, and thus the cross-sectional shape is trapezoidal, resulting in under-etching (a portion which should be removed by etching but remains unremoved).

Then, at S320, ions of a light element (hydrogen or helium) are implanted into the under-etched portion using the plasma etching apparatus 100 to form a damage layer 423 as shown in FIG. 7(c).

Lastly, at S330, wet etching is performed on the sample using the wet etching apparatus 200 to remove the damage layer 423 formed at S320 as shown in FIG. 7(d).

Next, details of the process S310 will be explained referring to the flowchart of FIG. 4.

First, the sample 107 is carried into the plasma etching apparatus 100 shown in FIG. 1 and placed on the sample holder 108 (S311). FIG. 7(a) shows the cross section of the portion of the sample 107 at this time in which the mask pattern is formed.

Then, the processing gas (etching gas) is supplied from the gas supply section 114 into the etching chamber 104 (S312). As the processing gas (etching gas) to be supplied, a gas as a mixture of chlorine ($Cl_2$) and hydrogen ($H_2$) or a gas as a mixture of chlorine ($Cl_2$), hydrogen ($H_2$), and methane ($CH_4$) is used and its flow rate is adjusted by the gas flow rate control section 115 before being supplied.

Then, the inside of the etching chamber 104 is vacuumized by the evacuation section 116 so that the inside of the etching chamber 104 is set to a prescribed pressure (S313).

In this state, a magnetic field is generated in the etching chamber 104 by the electromagnetic coils 106 arranged around the etching chamber 104, and microwave power is supplied from the microwave power source 101 into the etching chamber 104 through the waveguide 103 to generate a plasma in the etching chamber 104 and start electric discharge (S314).

This electric discharge condition is monitored by an etching monitor (not shown) to monitor the light emission condition (emission spectrum signal intensity) of the plasma in the etching chamber 104, and the detection of the end of the etching process (S315) is repeated (if the decision at S315 is NO) until the end of the etching process is detected.

When the end of the etching process is detected from a detection signal from the etching monitor (not shown) (if the decision at S315 is YES), the generation of the magnetic field by the electromagnetic coils 106 is stopped and the supply of microwave power from the microwave power source 101 is stopped to end the electric discharge in the etching chamber 104 (S316). Then, the supply of the processing gas (etching gas) into the etching chamber 104 is stopped (S317) to end the process.

At this stage, the cross section of the portion of the sample 107 in which the mask pattern is formed is shaped as shown in FIG. 7(b). In other words, the mask pattern 430 functions as a mask so that in the compound semiconductor material layer 420, the portion under the mask pattern 430 remains intact and the portion not covered by the mask pattern 430 is removed by plasma etching.

Here, the thickness (height) h of the compound semiconductor material pattern 421 is large as compared with pitch p between adjacent mask patterns 430 (aspect ratio is large) and thus a difference occurs in the amount of etching between the portion nearer to the mask pattern 430 and the portion remoter from the mask pattern 430 (nearer to the substrate 410). Therefore, in the compound semiconductor material layer 420, the width of the portion nearer to the substrate 410 is larger than the width of the portion nearer to the mask pattern 430 like the pattern 421 and the cross-sectional shape becomes trapezoidal with tapered side faces, resulting in under-etching.

Figure 5:
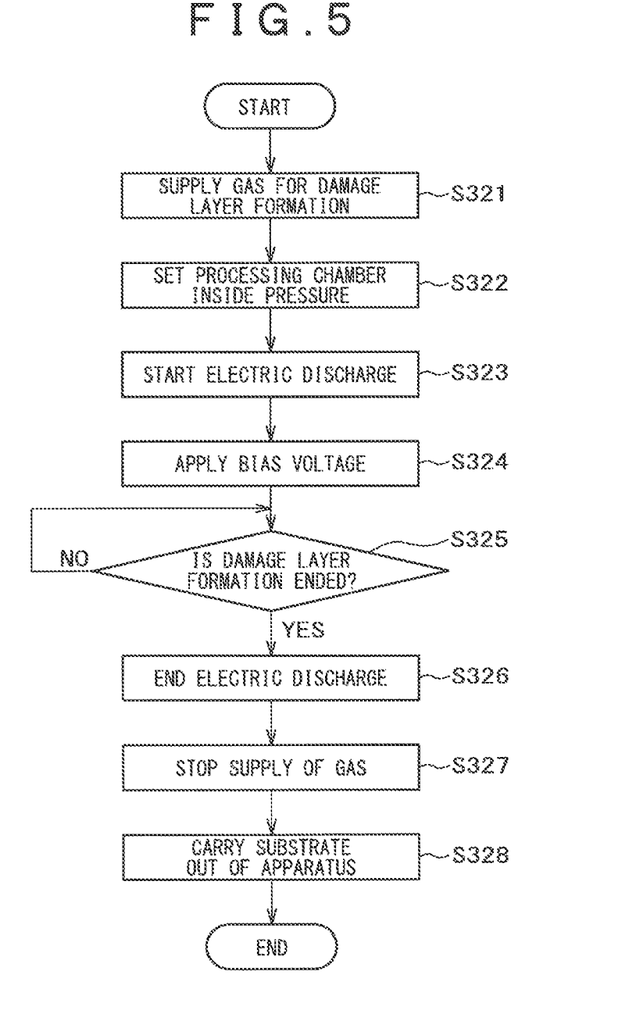
FIG. 5 is a flowchart which shows the processing flow of damage layer formation by plasma etching in the method for processing a compound semiconductor material according to the first embodiment of the present invention.

Next, the damage layer forming process (S320) by plasma etching will be explained referring to the flowchart of FIG. 5.

Figure 4:
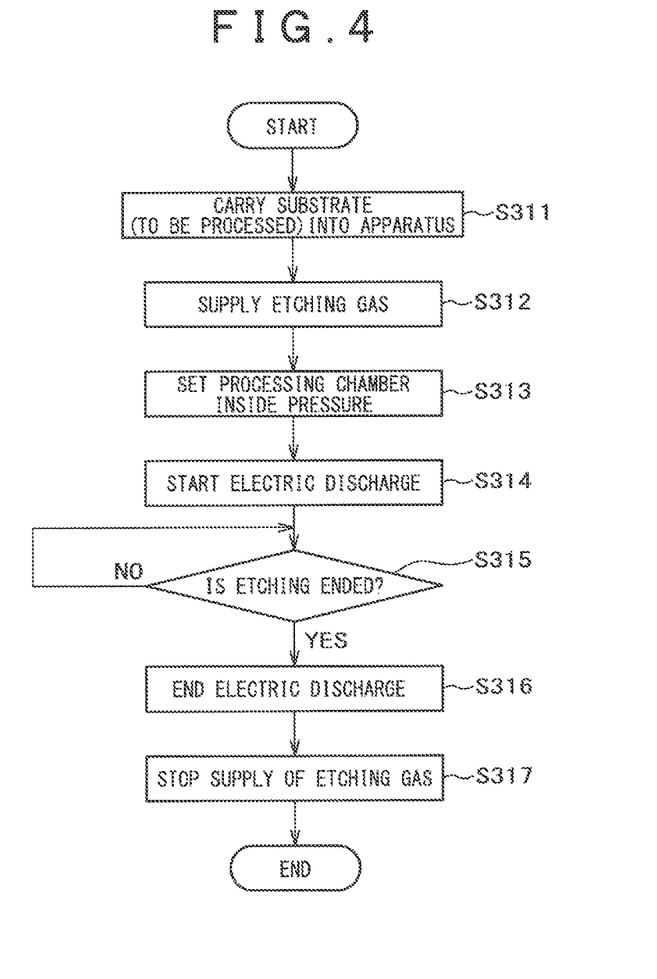
FIG. 4 is a flowchart which shows the flow of anisotropic processing by plasma etching in the method for processing a compound semiconductor material according to the first embodiment of the present invention.

While the sample 107, on which the anisotropic processing process (S310) by plasma etching as explained in reference to the flowchart of FIG. 4 has been finished, is placed on the sample holder 108 in the etching chamber 104, gas for forming a damage layer is supplied from the gas supply section 114 into the etching chamber 104 (S321).

If argon (Ar) is used as the gas which gives damage, its atom size is larger than that of hydrogen ($H_2$), so the ion implantation depth is shallower. Thus, the damage layer is formed by ion implantation only in the vicinity of the uppermost surface, and it is difficult to improve the taper angle (the angle between the inclined side face of the pattern 421 and the surface of the substrate 410 as shown in FIG. 7(b)) which results from under-etching. Therefore, it is desirable to select a gas containing a light element which has a smaller atomic radius and provides a relatively large ion implantation depth, such as hydrogen ($H_2$) or helium (He).

This embodiment uses a mixed gas which contains a light element (hydrogen or helium), as the processing gas to be supplied.

Then, the evacuation section 116 vacuumizes the inside of the etching chamber 104 so as to set the pressure in the etching chamber 104 to a prescribed pressure (S322). The pressure set at this step should be such a pressure that does not cause the ions generated in the plasma in the under-etched portion to collide with the other ions in the sheath region formed in the vicinity of the vertical surface of the sample 107. In other words, the pressure should be set so that the mean free path of ions is larger than the thickness of the sheath region.

Specifically, a mean free path L is expressed by Equation 1.

Equation 1:
$$L = \frac{k_B T}{\sqrt{2}\pi d_p^2}$$

The sheath length $d_{is}$ is expressed by Equation 2.

Equation 2:
$$d_{is} = 0.59 \times \sqrt{\frac{\varepsilon_0 \times T_e}{e \times n_p}} \times \left(\frac{2 \times e \times V}{T_e}\right)^{\frac{3}{4}}$$

where
- $\varepsilon_0$: vacuum dielectric constant,
- $\eta_p$: plasma density,
- T: gas temperature,
- e: elementary electric charge,
- V: voltage applied to the sample,
- d: atomic radius,
- $T_e$: electron temperature,
- $k_B$: Boltzmann constant,
- p: pressure in the etching chamber The mean free path L and sheath length $d_{is}$ are calculated on the assumption that the above values are as follows:
- $\varepsilon_0$: $8.85 \times 10^{-12}$ (F/m),
- $\eta_p$: $5.0 \times 10^{16}$ (/m$^3$),
- T: 363 (K),
- e: $1.60 \times 10^{-19}$ (C),
- V: 400 (V),
- $T_e$: 3.0 (eV),
- $k_B$: $1.38 \times 10^{-23}$ (m$^2 \cdot$kg/s$^2 \cdot$K)

In this embodiment, since ions of a light element (hydrogen, helium, or the like) are implanted in the under-etched portion using the plasma etching apparatus 100, if the atomic radius of hydrogen of $1.06 \times 10^{-10}$ (m) is used for d, the mean free path L for hydrogen as calculated in accordance with Equation 1 is 2.28 mm when the pressure p in the etching chamber is 44 Pa. On the other hand, when the sheath length $d_{is}$ is calculated by substituting the above values in Equation 2, the calculated length is 2.24 mm.

If the pressure p in the etching chamber 104 of the plasma etching apparatus 100 is set to 44 Pa or smaller, the mean free path L for hydrogen is larger than the sheath length $d_{is}$ and thus ion collision does not occur in the sheath region, and normal (vertical) incidence of hydrogen ions on the surface of the sample 107 is expected.

Then, a magnetic field is generated in the etching chamber 104 by the electromagnetic coils 106 arranged around the etching chamber 104, and microwave power is supplied from the microwave power source 101 into the etching chamber 104 through the waveguide 103 to generate a plasma and start electric discharge (S323). At the same time, in order to introduce the ions in the plasma into the sample 107, radio frequency power is applied from the radio frequency power source 110 to the sample holder 108 (S324).

Next, the relation between the ion energy and ion implantation depth as calculated by simulation will be explained referring to FIGS. 8 and 9.

Figure 8:
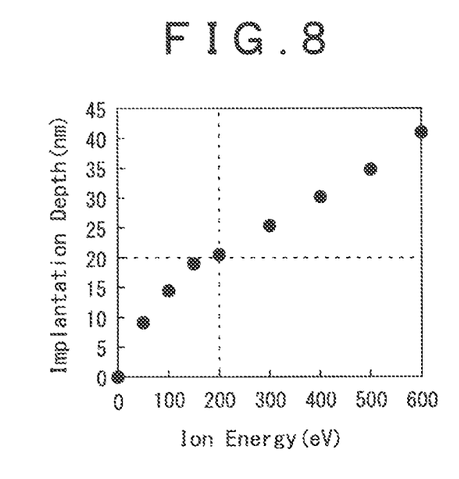
FIG. 8 is a graph which shows the relation between ion energy and ion implantation depth when the material (InGaAs) of the damage layer is irradiated with hydrogen ions.

FIG. 8 is a graph which shows the relation between ion energy and ion implantation depth when material $In_{0.53}Ga_{0.47}As$ is irradiated with hydrogen ($H_2$) ions. When the ion energy is increased, the ion implantation depth becomes larger. From the graph it is found that the ion energy should be 200 eV or more in order to ensure that the ion implantation depth is 20 nm.

Figure 9:
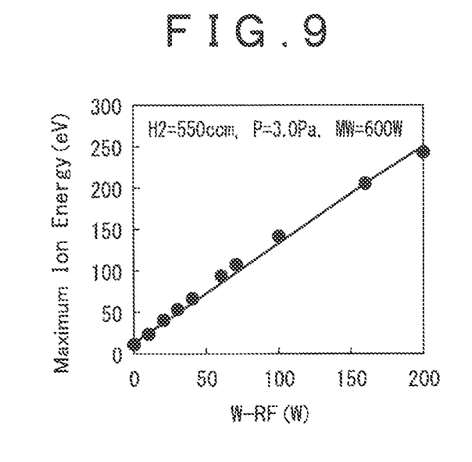
FIG. 9 is a graph which shows the relation between the power applied to the substrate sample holder and the energy of ions incident on the substrate as measured using the plasma etching apparatus according to the first embodiment of the present invention.

On the other hand, FIG. 9 is a graph which shows the relation between the radio frequency power W-RF applied from the radio frequency power source 110 to the sample holder 108 in order to introduce the ions in the plasma into the sample 107 and the ion energy of hydrogen ions incident on the surface of the sample 107 placed on the sample holder 108.

The graph shown in FIG. 9 shows the result of measurements made using the plasma etching apparatus 100 shown in FIG. 1 when the flow rate of hydrogen ($H_2$) supplied from the gas supply section 114 into the etching chamber 104 is 550 ccm, the pressure in the etching chamber 104 is 3.0 Pa, and the microwave power MW supplied from the microwave power source 101 is 600 W.

From the graph it is found that in order to ensure that the energy of hydrogen ($H_2$) ions incident on the sample 107 is 200 eV or more, the radio frequency power W-RF applied from the radio frequency power source 110 to the sample holder 108 should be 160 W or more.

Here, 2.45 GHz microwave power is supplied from the microwave power source 101 into the etching chamber 104. At this time, a magnetic field is generated in the etching chamber 104 by the electromagnetic coils 106 so that the ECR conditions are satisfied for the microwave power. By supplying microwave power to such a magnetic field, a high-density plasma is generated in the etching chamber 104.

When a high-density plasma is generated by supplying microwave power in this way, if the frequency of the radio frequency power applied from the radio frequency power source 110 to the sample holder 108 is 400 KHz, the influence of the radio frequency power on the high-density plasma generated in the etching chamber 104 is small, so the energy of ions incident on the sample 107 can be independently controlled by the radio frequency power which is applied from the radio frequency power source 110 to the sample holder 108.

When the sample 107 is irradiated with ions under this condition, the ions enter the surface of the sample 107 almost vertically, so as shown in FIG. 7(c), the ions entering the surface of the sample 107 almost vertically penetrate the tapered portions on both sides of the pattern 422 and form a damage layer 423.

After radiation with ions has been made for a prescribed time period, the step of damage layer formation is finished (YES at S325), the magnetic field generation by the electromagnetic coils 106 is stopped, the supply of microwave power from the microwave power source 101 is stopped, the application of radio frequency power from the radio frequency power source 110 to the sample holder 108 is stopped, and the electric discharge in the etching chamber 104 is stopped (S326).

Furthermore, the supply of gas from the gas supply section 114 into the etching chamber 104 is stopped (S327), the processed sample 107 is carried out of the etching chamber 104 (S328), and the damage layer forming process (S320) is ended.

Figure 6:
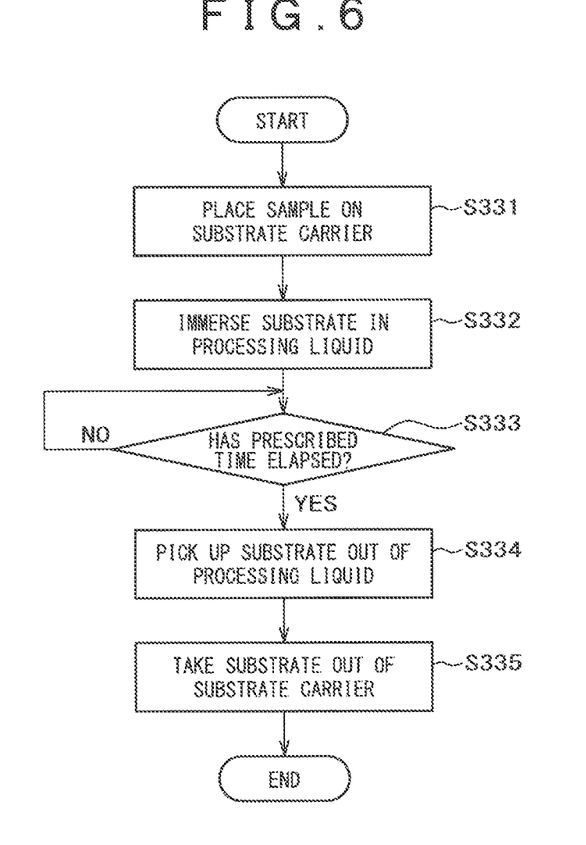
FIG. 6 is a flowchart which shows the processing flow of damage layer selective removal by wet etching in the method for processing a compound semiconductor material according to the first embodiment of the present invention.

Next, the damage layer selective removal process (S330) which selectively removes the damage layer formed at S320 by wet etching using the wet etching apparatus will be explained in detail referring to FIG. 6.

First, multiple samples 107 processed through the damage layer forming process (S320) using the plasma etching apparatus (samples 221 in FIG. 2) are loaded and set in place in the substrate carrier 220 of the wet etching apparatus 200 shown in FIG. 2 (S331).

Then, the control section 210 controls the substrate carrier drive 222 to move the substrate carrier 220 down into the etching liquid 206 accumulated in the processing liquid tank 201, immerse all the samples 221 in the etching liquid 206 (S332), and start wet etching.

As the samples 221 are immersed in the etching liquid 206, the damage layer 423 is removed by the etching liquid 206. At this time, portions other than the damage layer 423 are etched, but the etching rate for the damage layer 423 is larger than that for the other portions (etching selectivity is larger), so the damage layer 423 is selectively etched.

After the samples 221 are immersed in the etching liquid 206 for a prescribed time period (YES at S333), the control section 210 controls the substrate carrier drive 222 to move the substrate carrier 220 up and pick up the samples 221 out of the processing liquid tank 201 (S334).

Lastly, the samples 221 subjected to the wet etching process are taken out of the substrate carrier 220 (S335) and the damage layer selective removal process (S330) using the wet etching apparatus is ended.

According to this embodiment, vertical processing of the pattern on the sample can be achieved by anisotropic processing by plasma etching and the damage layer selective removal process by wet etching. Also, the unwanted damage layer can be removed at the same time by performing the wet etching process after plasma etching.

In the above example, as shown in FIG. 3, after anisotropic processing is first performed using the plasma etching apparatus 100 at S310, a damage layer is formed using the same plasma etching apparatus 100 at S320. Alternatively, however, the process S320 may be first carried out to form a damage layer in the portion not covered by the mask pattern 430 as shown in FIG. 7(a) and then anisotropic processing (S310) may be performed in the portion in which the damage layer has been formed.

According to this embodiment, a high-mobility channel material formed of a compound semiconductor having a low-volatility and is difficult to perform anisotropic processing can be vertically processed.

In addition, according to this embodiment, since a damage layer can be formed by producing a plasma of the light element in an environment with the desired pressure and enabling normal incidence of the ions in the plasma under the condition which does not cause collision of ions in the sheath region, the damage layer can be formed only in the portion not covered by the mask and thus vertical processing can be achieved.

In addition, since the formed damage layer is removed by the wet etching process, a high temperature process is not needed and the mask material need not have resistance to high temperatures. Therefore, the range of mask material choice is wider than before; for example, photoresist may be selected.

Furthermore, although this embodiment has been described above on the assumption that a microwave ECR plasma etching apparatus is used, even a plasma processing apparatus which adopts another plasma generating method such as a method for generating a capacitively coupled plasma or inductively coupled plasma can also bring about the same advantageous effects as this embodiment.

Furthermore, although this embodiment has been described on the assumption that a substrate is placed under a compound semiconductor material and a mask pattern is formed over the compound semiconductor material, in the present invention the mask pattern need not always be formed over the compound semiconductor material and the substrate need not always be placed under the compound semiconductor material.

Second Embodiment

Whereas the first embodiment concerns a method in which anisotropic processing and damage layer formation are performed using the plasma etching apparatus 100 and the damage layer is selectively removed by the wet etching process using the wet etching apparatus 200, the second embodiment concerns a method in which the damage layer is removed by reaction with radicals.

In the second embodiment, the anisotropic processing and damage layer formation process which are performed using the plasma etching apparatus 100 are the same as in the first embodiment and description thereof is omitted.

Figure 10:
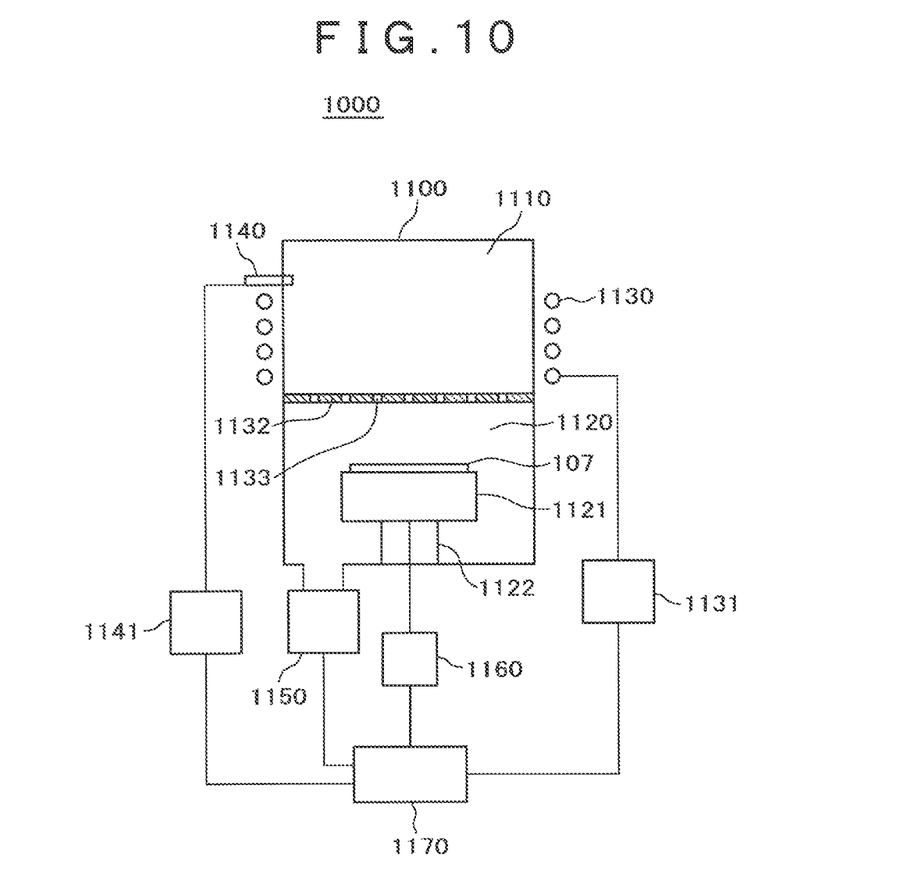
FIG. 10 is a block diagram which schematically shows the structure of a plasma processing apparatus according to a second embodiment of the present invention.

FIG. 10 shows the structure of a plasma processing apparatus 1000 for removing the damage layer by reaction with radicals which is used in this embodiment.

The plasma processing apparatus 1000 according to this embodiment includes a plasma processing chamber 1100 comprised of a plasma generating chamber 1110 and a radical radiation chamber 1120 and in the radical radiation chamber 1120, a substrate sample holder 1121 on which a sample 107 is placed and an insulating block 1122 for insulation between the substrate sample holder 1121 and the radical radiation chamber 1120 are located. The substrate sample holder 1121 is connected to a radio frequency power source 1160.

Coils (helical coil) 1130 are arranged around the plasma generating chamber 1110 and radio frequency power (for example, radio frequency power of 13.56 MHz) is applied from a coil power source 1131 to the coils 1130 to generate a plasma in the plasma generating chamber 1110.

A gas supply nozzle 1140 for supplying gas for plasma generation (for example, argon gas Ar) is attached to the plasma generating chamber 1110. The flow rate of gas which is supplied from the gas supply nozzle 1140 into the plasma generating chamber 1110 is controlled by a gas flow rate control section 1141.

Inside the plasma processing chamber 1100, a porous plate 1132 made of a conductor such as metal with many small holes 1133 is provided to separate the plasma generating chamber 1110 and the radical radiation chamber 1120. The porous plate 1132 and the plasma generating chamber 1110 are electrically connected.

Also, a vacuum pump 1150 is connected to the radical radiation chamber 1120 to vacuumize the inside of the radical radiation chamber 1120 and the inside of the plasma generating chamber 1110.

The coil power source 1131, gas flow rate control section 1141, vacuum pump 1150, and radio frequency power source 1160 are controlled by the control section 1170.

In the plasma processing apparatus 1000 thus structured, after the vacuum pump 1150 is activated to vacuumize the inside of the radical radiation chamber 1120 and the inside of the plasma generating chamber 1110, the gas whose flow rate is controlled by the gas flow rate control section 1141 is supplied from the gas supply nozzle 1140 into the plasma generating chamber 1110.

After the pressure in the plasma generating chamber 1110 supplied with gas from the gas supply nozzle 1140 reaches a prescribed pressure, radio frequency power is applied to the coils 1130 from the coil power source 1131 to generate an inductively coupled plasma in the plasma generating chamber 1110.

The many small holes 1133 made in the porous plate 1132 have such a size that prevents passage of the ions in the inductively coupled plasma generated in the plasma generating chamber 1110. On the other hand, electrically neutral radicals from the inductively coupled plasma generated in the plasma generating chamber 1110 can pass through the many small holes 1133 made in the porous plate 1132 and are supplied to the radical radiation chamber 1120.

When the sample 107 placed on the substrate sample holder 1121 has a damage layer 423 formed as shown in FIG. 7(c) in the first embodiment, the damage layer 423 is selectively etched by the radicals supplied from the inductively coupled plasma region of the plasma generating chamber 1110 to the radical radiation chamber 1120 through the many small holes 1133 and consequently the sample 107 is shaped as shown in FIG. 7(d).

Figure 11:
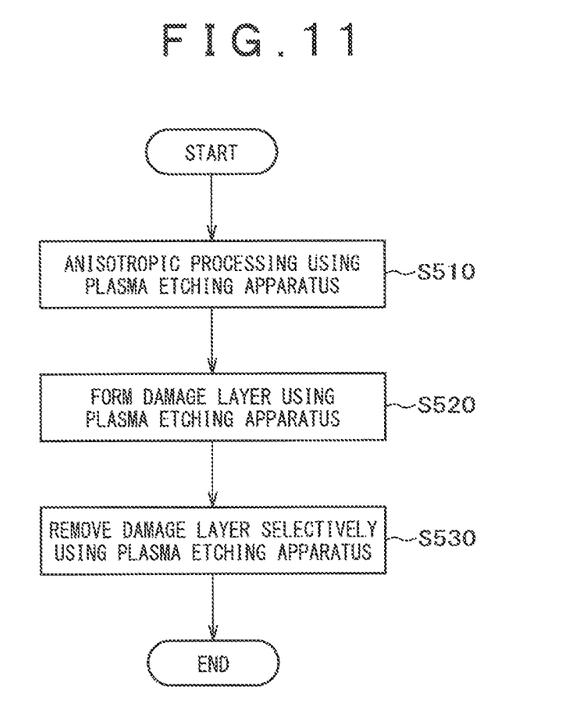
FIG. 11 is a flowchart which shows the processing flow in the method for processing a compound semiconductor material according to the second embodiment of the present invention.

FIG. 11 shows the processing flow in this embodiment which corresponds to the flowchart of FIG. 3 in the first embodiment. The anisotropic processing step (S510) using the plasma processing apparatus and the damage layer forming step (S520) using the plasma etching apparatus are the same as steps S310 and S320 in the first embodiment respectively.

On the other hand, the damage layer selective removal step (S530) using the plasma processing apparatus is performed as explained above. Specifically, using the plasma processing apparatus 1000, the damage layer 423 formed on the sample 107 is selectively etched and removed by the radicals which are passed from the inductively coupled plasma generated in the plasma generating chamber 1110 through the small holes 1133 in the porous plate 1132 and supplied to the radical radiation chamber 1120.

Figure 12:
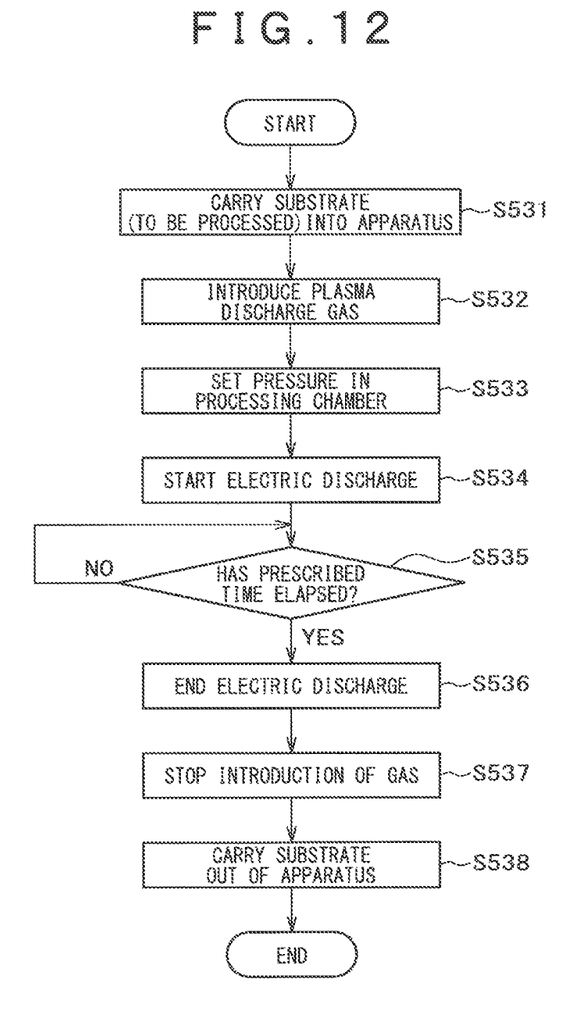
FIG. 12 is a flowchart which shows the processing flow of damage layer selective removal using the plasma processing apparatus in the method for processing a compound semiconductor material according to the second embodiment of the present invention.

FIG. 12 shows details of step S530.

First, the sample 107 is carried into the radical radiation chamber 1120 of the plasma processing apparatus 1000 shown in FIG. 10 and placed on the substrate sample holder 1121 (S531). At this time, the cross section of the portion of the sample 107 in which the mask pattern is formed is shaped with a damage layer 423 as shown in FIG. 7(c).

Then, while the inside of the radical radiation chamber 1120 and the inside of the plasma generating chamber 1110 are vacuumized by the vacuum pump 1150, gas for plasma discharge is supplied from the gas supply nozzle 1140 into the plasma generating chamber 1110 (S532). The plasma discharge gas to be supplied should be a gas which can selectively remove the damage layer by reaction with radicals, and it should be supplied at the flow rate adjusted by the gas flow rate control section 1141.

Then, while plasma discharge gas is supplied into the plasma generating chamber 1110, the vacuum pump 1150 vacuumizes the inside of the radical radiation chamber 1120 and the inside of the plasma generating chamber 1110 so that the pressure in each of the radical radiation chamber 1120 and the plasma generating chamber 1110 is set to become a prescribed pressure (S533).

In this condition, radio frequency power is applied from the coil power source 1131 to the coils 1130 arranged around the plasma generating chamber 1110 to generate an inductively coupled plasma in the plasma generating chamber 1110 and start electric discharge (S534).

After this electric discharge is continued for a prescribed time period (YES at S535), the application of radio frequency power from the coil power source 1131 to the coils 1130 is stopped to end the electric discharge in the plasma generating chamber 1110 (S536). Then, the supply of processing gas (etching gas) into the plasma generating chamber 1110 is stopped (S537).

In this condition, the cross section of the portion of the sample 107 in which the mask pattern lies is shaped with the damage layer 423 removed as shown in FIG. 7(d).

Lastly, the sample 107, in which the damage layer 423 has been removed, is taken out of the substrate sample holder 1121 and carried out of the plasma processing apparatus 1000 (S538) to end a series of processing steps.

According to this embodiment, as in the first embodiment, a high-mobility channel material as a low-volatility compound semiconductor on which it is difficult to perform anisotropic processing can be vertically processed.

In addition, in this embodiment as well, as in the first embodiment, since a damage layer can be formed by generating a plasma of a light element in an environment with the desired pressure and enabling normal incidence of the ions in the plasma under the condition which does not cause collision of ions in the sheath region, the damage layer can be formed only in the portion not covered by the mask and thus vertical processing can be achieved.

In addition, since the formed damage layer is removed by reaction with radicals in the plasma process, a high temperature process is not needed and the mask material need not have resistance to high temperatures. Therefore, the range of mask material choice is wider than before; for example, photoresist may be selected.

Furthermore, even when the plasma processing apparatus adopts a plasma generating method for generating a microwave ECR plasma, capacitively coupled plasma or inductively coupled plasma, it can bring about the same advantageous effects as this embodiment. Also, even a remote plasma processing apparatus can bring about the same advantageous effects as this embodiment.

Although the first embodiment and second embodiment have been so far described on the assumption that the material to be etched is a compound semiconductor material, the present invention is not limited to application for improvement of a tapered shape caused by etching of a refractory material, but the present invention can be applied to improvement of a tapered shape of a material usually used in the semiconductor manufacturing process.

For example, the present invention can be applied to Si, SiGe, Ge, SiN, $SiO_2$, and the like used in the front-end process or low-k materials used for an interlayer film in the back-end process, such as SiOC, SiON, and SiOCN.

The present invention is not limited to the above embodiments but it includes various modifications. The above embodiments have been described in detail for easy understanding of the present invention and the present invention is not limited to a structure which includes all the elements described above. For an element of the first embodiment, addition of another element, deletion, or replacement can be made.

What is claimed is:

1. A semiconductor device manufacturing method comprising the steps of:
    etching a semiconductor material formed on a substrate to have a trapezoidal shape in a cross-section view using a plasma;
    forming a damage layer in an etched sidewall linear tapered portion of the semiconductor material which has the trapezoidal shape in the cross-section view, wherein the damage layer is formed on a surface of the substrate and does not extend into a material forming the substrate; and
    removing the damage layer.

2. The semiconductor device manufacturing method according to claim 1, wherein the step of removing the damage layer is performed by wet etching.

3. The semiconductor device manufacturing method according to claim 1, wherein the step of removing the damage layer is performed by using a plasma.

4. The semiconductor device manufacturing method according to claim 1, wherein the semiconductor material is a compound semiconductor material.

5. The semiconductor device manufacturing method according to claim 4, wherein the step of forming the damage layer is performed by using a plasma generated using a hydrogen gas or a helium gas.

6. The semiconductor device manufacturing method according to claim 4, wherein the step of etching is performed by using a mixture gas of a chlorine gas and a hydrogen gas, or a mixture gas of a chlorine gas, a hydrogen gas, and a methane gas.

7. The semiconductor device manufacturing method according to claim 6, wherein the damage layer forming step is performed by using plasma generated using a hydrogen gas or a helium gas.

\* \* \* \* \*